(12) United States Patent
Steinbach et al.

(10) Patent No.: US 7,920,653 B2
(45) Date of Patent: Apr. 5, 2011

(54) METHOD AND CIRCUIT ARRANGEMENT FOR SUPPRESSING AN ORTHOGONAL PERTURBATION

(75) Inventors: Ingo Steinbach, Freiburg (DE); Hans Fiesel, Gundelfingen (DE); Miodrag Temerinac, Gundelfingen (DE)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 620 days.

(21) Appl. No.: 11/243,489

(22) Filed: Oct. 4, 2005

(65) Prior Publication Data
US 2006/0072686 A1 Apr. 6, 2006

(30) Foreign Application Priority Data

Oct. 4, 2004 (DE) .................. 10 2004 048 572

(51) Int. Cl.
*H03D 3/22* (2006.01)
(52) U.S. Cl. ........................................... 375/326
(58) Field of Classification Search ............ 375/324, 375/326, 329, 261
See application file for complete search history.

(56) References Cited

U.S. PATENT DOCUMENTS

| | | | |
|---|---|---|---|
| 4,484,194 A | 11/1984 | Arvidsson | |
| 4,608,703 A | 8/1986 | Kaga et al. | |
| 4,729,110 A | 3/1988 | Welles, II et al. | |
| 4,860,018 A | 8/1989 | Counselman, III | |
| 4,871,975 A | 10/1989 | Nawata et al. | 329/124 |
| 4,977,580 A | 12/1990 | McNicol | 375/97 |
| 5,148,451 A | 9/1992 | Otani et al. | |
| 5,321,514 A | 6/1994 | Martinez | |
| 5,507,024 A | 4/1996 | Richards, Jr. | |
| 5,572,264 A | 11/1996 | Mizukami et al. | |
| 5,604,768 A | 2/1997 | Fulton | 375/220 |
| 5,636,312 A | 6/1997 | Okamoto et al. | |
| 5,748,262 A | 5/1998 | Boie | |
| 5,825,242 A | 10/1998 | Prodan et al. | |
| 5,828,705 A * | 10/1998 | Kroeger et al. | 375/326 |
| 5,831,689 A | 11/1998 | Boie | |
| 5,893,025 A | 4/1999 | Bessho et al. | |
| 5,956,374 A | 9/1999 | Iwamatsu | |
| 6,005,363 A | 12/1999 | Aralis et al. | |

(Continued)

FOREIGN PATENT DOCUMENTS

DE 197 39 645 3/1999 ................ 7/27

(Continued)

OTHER PUBLICATIONS

J. Ammer et al., "Timing Recovery Unit for a 1.6 Mbps DSSS Receiver," [Online] Dec. 12, 2000, pp. 1-28, XP-002448107, University of Berkeley, USA, URL: http://bwrc.eecs.berkeley.edu/People/Grad_Students/msheets/ee225c/EE225c_final_ammer_sheets.pdf.

(Continued)

*Primary Examiner* — David C Payne
*Assistant Examiner* — Leon-Viet Q Nguyen
(74) *Attorney, Agent, or Firm* — O'Shea Getz P.C.

(57) ABSTRACT

The invention relates to a method as well as a circuit arrangement for suppression of a perturbing quadrature component of a carrier signal of an amplitude-modulated signal during the recovery of the carrier signal in a synchronous demodulator, which outputs a quadrature signal (Q). The perturbing quadrature component of the carrier signal is estimated and the estimated quadrature component is subtracted from the quadrature signal (Q).

6 Claims, 9 Drawing Sheets

U.S. PATENT DOCUMENTS

| | | | |
|---|---|---|---|
| 6,028,903 | A | 2/2000 | Drost et al. |
| 6,075,409 | A | 6/2000 | Khlat |
| 6,133,964 | A | 10/2000 | Han |
| 6,184,921 | B1 | 2/2001 | Limberg |
| 6,233,295 | B1 | 5/2001 | Wang |
| 6,259,751 | B1 | 7/2001 | Park et al. |
| 6,304,136 | B1 * | 10/2001 | Rabii ............................ 329/300 |
| 6,307,898 | B1 * | 10/2001 | Ido ................................ 375/326 |
| 6,559,899 | B1 | 5/2003 | Suzuki et al. |
| 6,614,734 | B1 | 9/2003 | Lebowsky et al. |
| 6,661,852 | B1 * | 12/2003 | Genrich ........................ 375/326 |
| 7,107,011 | B2 | 9/2006 | Nakazawa et al. |
| 7,593,065 | B2 | 9/2009 | Temerinac et al. |
| 2002/0097812 | A1 | 7/2002 | Wiss |
| 2003/0203728 | A1 | 10/2003 | Filipovic |
| 2004/0081257 | A1 | 4/2004 | Lin et al. |
| 2005/0069055 | A1 * | 3/2005 | Song et al. ................... 375/324 |
| 2005/0110540 | A1 | 5/2005 | Kwak |
| 2005/0232376 | A1 * | 10/2005 | Liem et al. ................... 375/322 |
| 2006/0067431 | A1 | 3/2006 | Steinbach |

FOREIGN PATENT DOCUMENTS

| | | | |
|---|---|---|---|
| EP | 0065150 | 3/1986 | |
| EP | 0696854 | 2/1996 | |
| EP | 0963110 | 12/1999 | ........................ 5/455 |
| EP | 1 487 166 | 12/2004 | ........................ 27/227 |
| JP | 5731235 | 2/1982 | |
| JP | 62233942 | 10/1987 | |
| JP | 6104788 | 4/1994 | |
| JP | 6112858 | 4/1994 | |
| JP | 7326980 | 12/1995 | |
| JP | 2000049879 | 2/2000 | |
| JP | 2002044174 | 2/2002 | |
| JP | 2004112384 | 4/2004 | |
| KR | 1020000008080 | 2/2000 | |
| KR | 1020030036594 | 5/2003 | |
| WO | WO 01/05025 | 1/2001 | |

OTHER PUBLICATIONS

W. Gao et al., "All-Digital Reverse Modulation Architecture Based Carrier Recovery Implementation for GMSK and Compatible FQPSK," IEEE Transactions on Broadcasting, vol. 42, No. 1, Mar. 1996, pp. 55-62, XP011006019.

Japanese Office Action.

Japanese Office Action, Dated Apr. 15, 2010.

* cited by examiner

METHOD AND CIRCUIT ARRANGEMENT FOR SUPPRESSING AN ORTHOGONAL PERTURBATION

PRIORITY INFORMATION

This patent application claims priority from German patent application 10 2004 048 572.0 filed Oct. 4, 2004, which is hereby incorporated by reference.

BACKGROUND OF THE INVENTION

The invention relates to the field of carrier signal recovery, and in particular to suppression of a perturbing quadrature component of a carrier signal of an amplitude-modulated signal during the recovery of the carrier signal in a synchronous demodulator, which outputs a quadrature signal.

To receive an amplitude-modulated signal (e.g., an analog television signal), one must first select a particular channel, which is mixed by a tuner onto an intermediate frequency $f_{Z1}$ (e.g., $f_{Z1}$=38.9 MHz). In order to demodulate this signal by digital signal processing, one would need an analog-to-digital converter (ADC) with a very high sampling rate $f_{AT1}$ and resolution $b_1$ (e.g., $f_{AT1}$=100 MHz/$b_1$=10 bit). Therefore, the signal is mixed onto a second, lower intermediate frequency $f_{Z2}$. This intermediate frequency $f_{Z2}$ is ideally a frequency that corresponds to the channel raster in the HF band (e.g., $f_{Z2}$=7 MHz).

Given suitable frequency selection, the intermediate signal can now be digitally converted with a much lower sampling frequency $f_{AT2}$. The digitized signal is mixed by a synchronous demodulator into the base band, while the carrier frequency $f_T$ (preferably the picture carrier frequency $f_{BT}$) is generated by a fully digital phase-locked loop (PLL). By further digital filtering of the resulting in-phase and quadrature component, the signal (e.g., a picture and/or sound information) is extracted.

Figure 6:
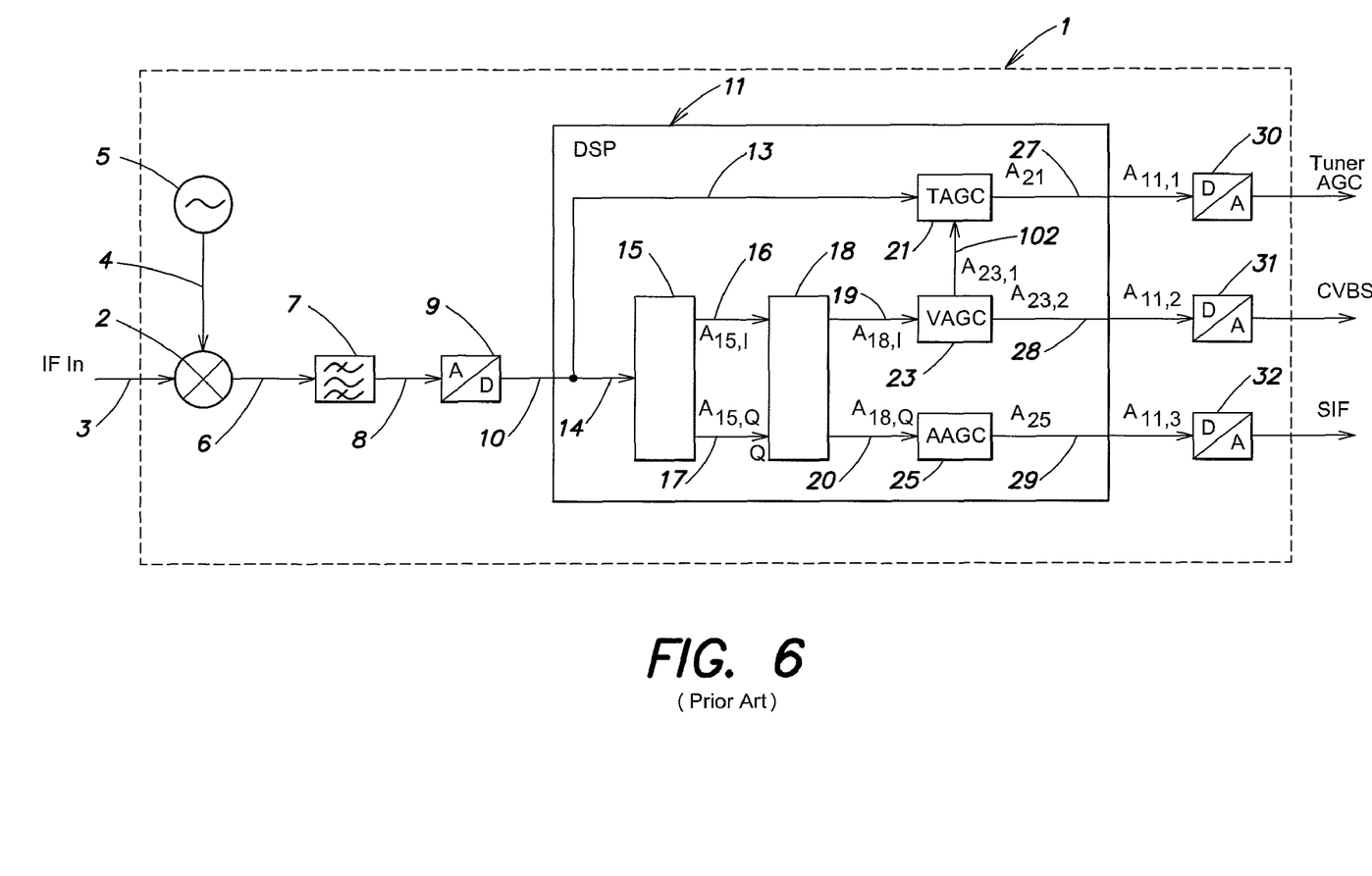
FIG. 6 is a block diagram of a prior art TV receiver.

FIG. 6 illustrates, as an example, a prior art basic layout of a digital TV receiver. The digital TV receiver 1 includes a mixer 2 that receives an intermediate frequency (IF) input on a line 3. A local oscillator 5 provides a signal on a line 4 to a second input of the mixer 2, which provides a mixed output on a line 6 to a bandpass filter 7. The bandpass filter 7 provides a filtered signal on a line 8 to an analog-to-digital converter (ADC) 9, which provides a digitized signal on a line 10 to a digital signal processor (DSP) 11.

The digitized signal on the line 10 is input to an automatic gain control (AGC) device 21 for a tuner (channel selection device), and to a synchronous demodulator 15. The synchronous demodulator 15 provides an in-phase signal output $A_{15,I}$ and a quadrature signal output $A_{15,Q}$ on lines 16, 17 respectively. Both signals are input to a filter device 18. The filter device 18 provides an in-phase signal output $A_{18,I}$ and a quadrature signal output $A_{18,Q}$ on lines 19, 20, respectively. The in-phase signal on the line 19 is input to an automatic gain control unit for video signals 23.

The automatic gain control unit for video signals 23 provides a first output designated $A_{23,1}$ on a line 102 and a second output designated $A_{23,2}$ on a line 28.

The first output $A_{23,1}$ on the line 102 is input to the automatic gain control unit for tuner signals 21, which provides its single output $A_{21}$ on line 27 to the aforementioned first output $A_{11,1}$ of the digital signal processor 11.

The second output $A_{23,2}$ on the line 28 is provided to the aforementioned second output $A_{11,2}$ of the digital signal processor. The quadrature signal output $A_{18,Q}$ on the line 20 is input to an automatic gain control unit 25 for audio signals, which provides an output $A_{25}$ on a line 29 to the third output $A_{11,3}$ of the digital signal processor 11.

The outputs $A_{11,1}$, $A_{11,2}$, $A_{11,3}$ on lines 27-29 respectively, are input to digital-to-analog converters (DAC) 30, 31, 32, respectively. The DAC 30 provides an analog tuner AGC signal; the DAC 31 provides an analog color video blanking signal (CVBS); and the DAC 32 provides a sound IF signal (SIF). The digital TV receiver 1 of FIG. 6 operates as follows.

The digital TV receiver 1 receives an input signal on the line 3, and the mixer 2 converts the signal into a second intermediate frequency, the so-called second IF. This second IF signal on the line 6 is bandpass filtered, to remove unwanted mixing products from the signal so it can be digitized without signal aliasing by the ADC 9.

In the digital section 11, the digitized signal on the line 10 is mixed by the synchronous demodulator 15 into the base band. The outputs $A_{15,I}$, $A_{15,Q}$ of the synchronous demodulator 15 are presented as demodulated in-phase and quadrature signals I, Q. By further filtering and various other algorithms in the filter device 18, the video signal and the sound IF signal are obtained from the I/Q data. The tuner AGC 21 adjusts the tuner output level so that the ADC 9 connected to the input $E_{11}$ of the $DSP_S$ 11 is not overmodulated. The $VAGC$ 23 and $AAGC$ 25 (video AGC and audio AGC) connected to the output signals on the line 19, 20, respectively, are optimally modulated for the DACs 31, 32.

If one considers the ideal case of a second IF signal supplied to the input $E_9$ of the ADC 9 with cosine picture carrier signal with picture carrier frequency $f_{BT}$, cosine picture information signal with picture information frequency $f_{picture}$ and cosine sound carrier signal with sound carrier frequency $f_{TT}$ and cosine sound information signal with sound information frequency $f_{sound}$, this can be described by the following equation:

$$u(t) = \underbrace{\hat{u}_{BT} \cdot \cos(2\pi f_{BT}t) \cdot (1 + m \cdot \cos(2\pi f_{picture}t))}_{Picture(AM-Modulation)} + \qquad (Eq.\ 1)$$

$$\underbrace{\hat{u}_{TT} \cdot \cos(2\pi f_{TT}t + \Delta\varphi_{TT} \cdot \cos(2\pi f_{Sound}t))}_{Sound(FM-Modulation)}$$

with:

$\hat{u}_{BT}$ picture carrier amplitude m modulation index $\hat{u}_{TT}$ sound carrier amplitude $\Delta\phi_{TT}$ phase deviation of the FM modulation The sound carrier is irrelevant to the processing of the picture carrier and is therefore filtered out within the carrier recovery process. After the filtering, one gets a signal that can be described by the following equation:

$$u(t) = \underbrace{\hat{u}_{BT} \cdot \cos(2\pi f_{BT}t) \cdot (1 + m \cdot \cos(2\pi f_{picture}t))}_{Picture(AM-Modulation)} \qquad (Eq.\ 2)$$

Figure 7A:
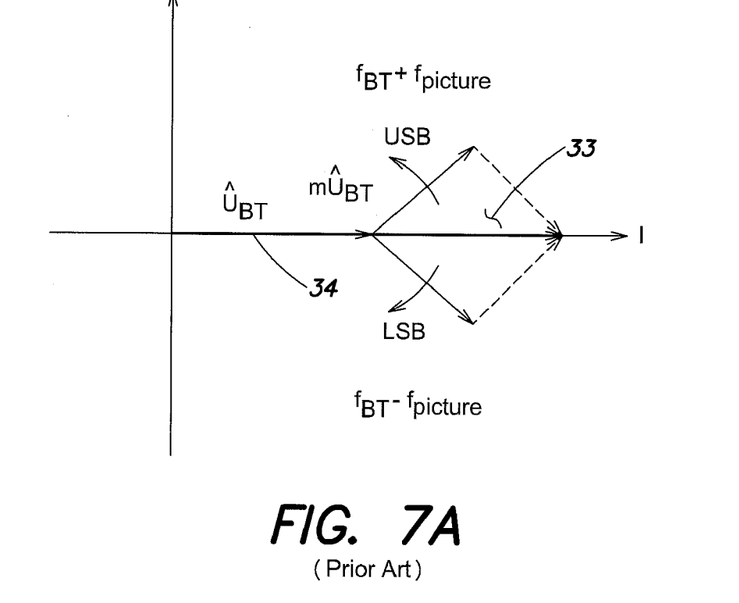
FIGS. 7A and 7B are phasor diagrams of a prior art amplitude-modulated television signal picture carrier, where the illustration of FIG. 7A is without a perturbing component.

FIG. 7A illustrates a phasor diagram of this amplitude-modulated signal. In this case, the carrier recovery is locked onto the sum of the picture carrier 34 and the two side bands, that is the upper side band (USB), and the lower side band (LSB) representing the picture information 33.

Figure 7B:
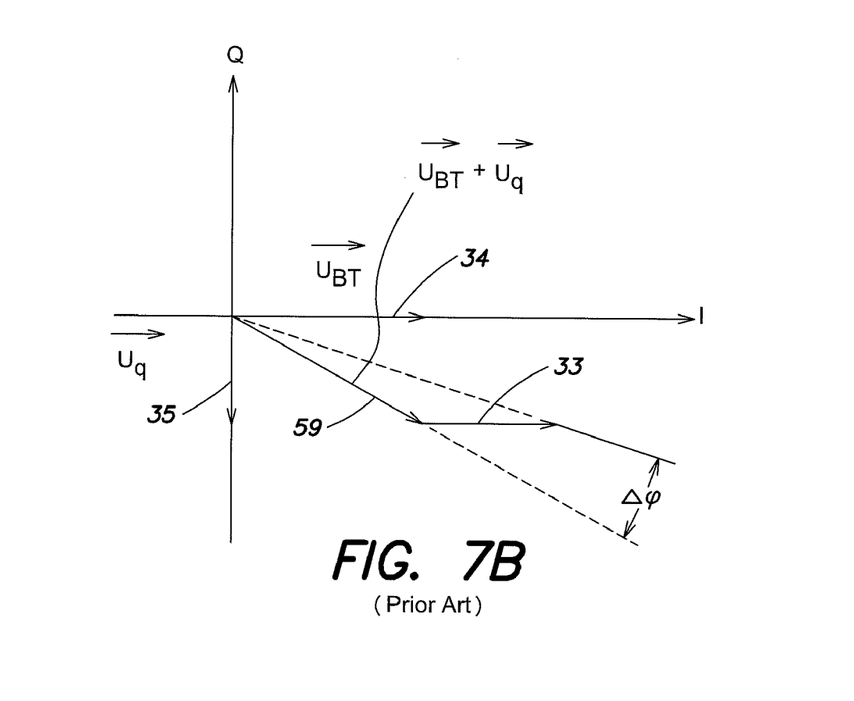

For example, lack of symmetry in the transmission modulator or in the analog signal processing of the TV receiver 1 can perturb the picture carrier 34 with an orthogonal component 35 (FIG. 7B). Thus, from (Eq. 2):

$$u(t) = \underbrace{(\hat{u}_{BT} \cdot \cos(2\pi f_{BT} t) + \hat{u}_q(t) \cdot \sin(2\pi f_{BT} t)) \cdot (1 + m \cdot \cos(2\pi f_{picture} t))}_{Picture(AM-Modulation)}$$ (Eq. 3)

with:

$\hat{u}_q(t)$ amplitude of the perturbing component

In the corresponding phasor representation, shown in FIG. 7B, this shows up as a phase modulation $\Delta\phi$ in amplitude changes of the information 33. When recovering the carrier, this phase modulation $\Delta\phi$ must be equalized as precisely as possible.

Demodulators according to the prior art are dimensioned such that the phase modulation is constantly adjusted by the carrier processing. This has the result, first, that rapid following of the picture carrier will correctly reconstruct the information even when an orthogonal carrier component exists, but because (e.g., in analog television) the sound carrier is mixed by the reconstructed picture carrier onto the sound intermediate frequency, it is subject to the same frequency changes, which translates into an additional frequency modulation. Secondly, the large required bandwidth of the carrier control process also adjusts the noise to maximum amplitude, which results in reducing the signal-to-noise ratio (SNR).

Figure 8:
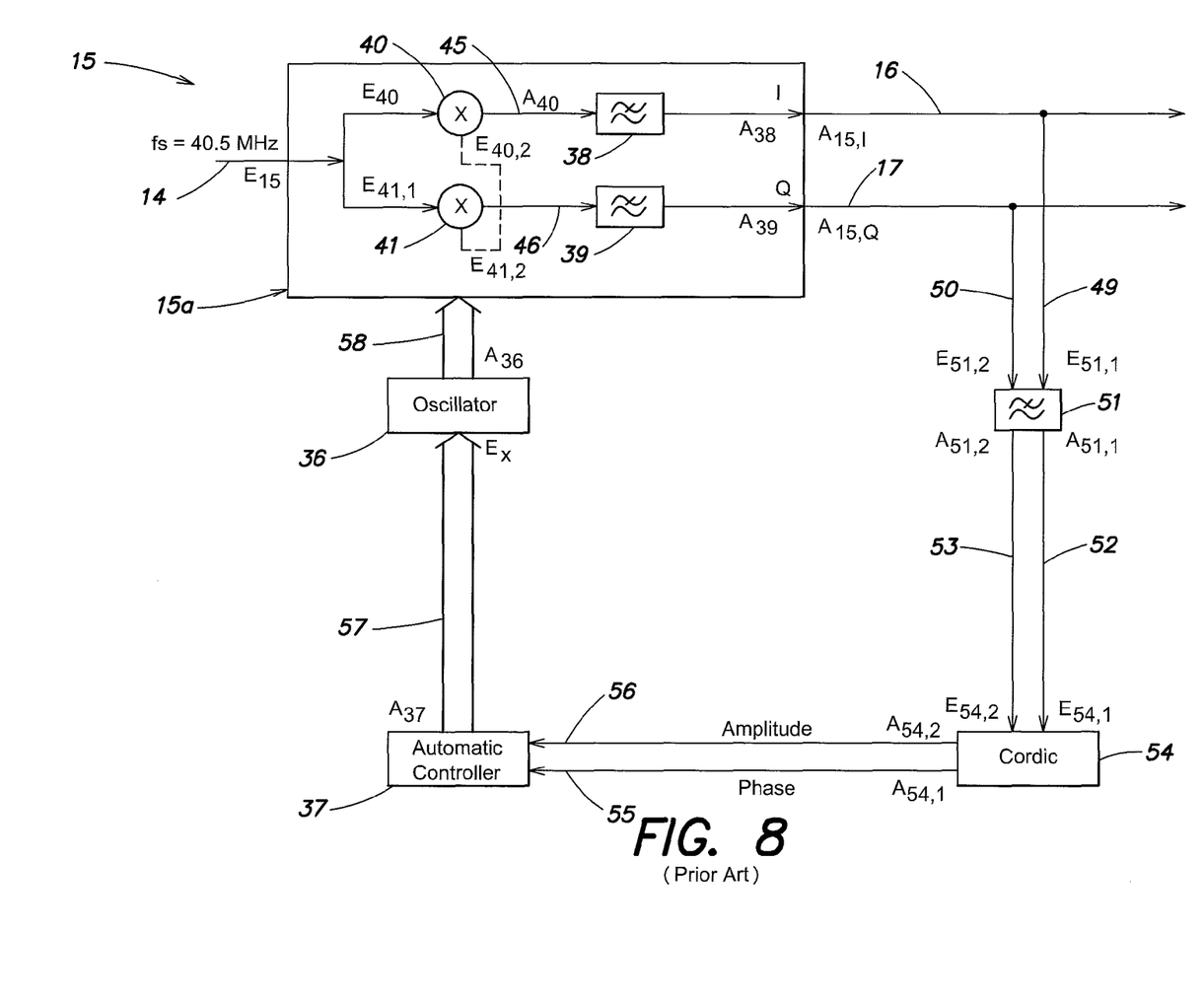
FIG. 8 is a block diagram of a prior art synchronous demodulator with carrier processing device.

The digital carrier processing in the digital signal processor 11 according to FIG. 6, as is implemented in the prior art, is represented as a block diagram in FIG. 8.

In particular, one notices in FIG. 8 the synchronous demodulator 15 from FIG. 6. The synchronous demodulator 15 includes an I/Q demodulator 15a, which converts an input signal into an in-phase signal I and a quadrature signal Q. Furthermore, a circuit arrangement is provided, which obtains the picture carrier signal BT from the in-phase signal I and the quadrature signal Q and takes it directly to a first mixer 40 of the I/Q demodulator 15a and with a 90° phase shift to a second mixer 41 of the I/Q demodulator 15a.

Specifically, the I/Q demodulator 15a is constructed in the usual manner. It comprises one input $E_{15}$ and two outputs, namely, an in-phase signal output $A_{15,I}$ and a quadrature signal output $A_{15,Q}$. The input $E_{15}$ is provided on the line 14 to the first mixer 40, and the second mixer 41. Both mixers 40, 41 have an additional second input $E_{40,2}$, $E_{41,2}$, which receive the picture carrier signals BT in the above-mentioned manner.

The mixer 40 provides an output on a line 45 to a first low-pass filter 38. The mixer 41 provides an output on a line 46 to a second low-pass filter 39.

The first low-pass 38 provides the in-phase signal output $A_{15,I}$ on the line 16, and the second low-pass 39 provides the quadrature signal output $A_{15,Q}$ on the line 17.

The signals on the lines 16, 17 are input to a low-pass filter 51, which filters each of the signals to provide outputs $A_{51,1}$ and $A_{51,2}$ on lines 52, 53, respectively to a computer unit 54 corresponding to the inputs $E_{51,1}$ and $E_{51,2}$, respectively.

The computer unit (i.e., CORDIC) 54 provides outputs $A_{54,1}$, $A_{54,2}$ on lines 55, 56 to an automatic controller 37.

One or more outputs $A_{37}$ of the computer unit 37 are provided on lines 57 to a digital I/Q oscillator 36, which provides signals on the lines 58 to the mixers 40 and 41.

The low-pass filter 51 selects the picture carrier, which lies here in the baseband ($f_{BT} \approx 0$ Hz). The subsequent Coordinate Rotation Digital Computer (CORDIC) 54 determines, from the low-pass filtered I/Q pairs of values (i.e., the signals on the lines 52, 53), the phase 55 and the amplitude 56. The phase on the line 55 constitutes the phase difference between the picture carrier of the received signal on the line 14 and the local carrier on the line 58 of the I/Q oscillator 36. The phase on the line 55 is converted in the automatic controller 37 to a correction signal on the line 57, in order to follow the local I/Q oscillator 36. After several iterations (loop passes), the carrier on the line 58 is matched to the received carrier on the line 14.

In the above-described digital implementation of the carrier control process, a bandwidth comparable to the analog solution can only be achieved with difficulty. The bandwidth is limited by the relatively large signal delay within the automatic control loop (filtering, phase and amplitude measuring with Cordic algorithm).

Upon receiving an analog television signal, this has effects on the demodulated video signal as well as the demodulated sound carrier, since the latter is also frequency-modulated by the adjustment of the PLL. FIG. 9 illustrates the impact of a quadrature component in the in-phase signal on the demodulated video signal.

The sound carrier is converted by the local I/Q oscillator 36 into the sound intermediate frequency. If, due to an orthogonal perturbing component of the picture carrier, a phase modulation of the picture carrier occurs, this translates into a frequency modulation of the sound intermediate frequency carrier, since the local carrier 58 follows the phase modulation.

Figure 9A:
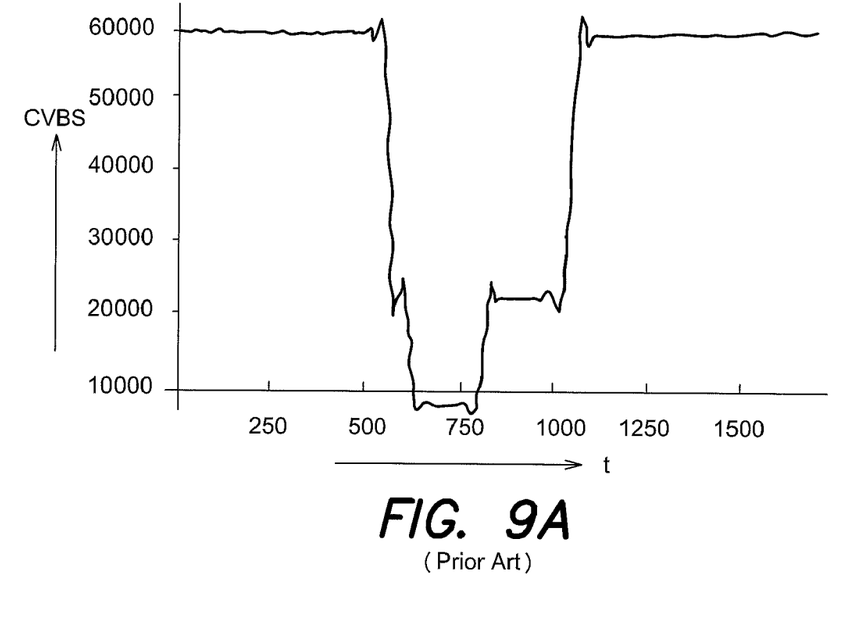
FIGS. 9A and 9B illustrate the impact of an orthogonal perturbation on a demodulated video signal (prior art).
Figure 9B:
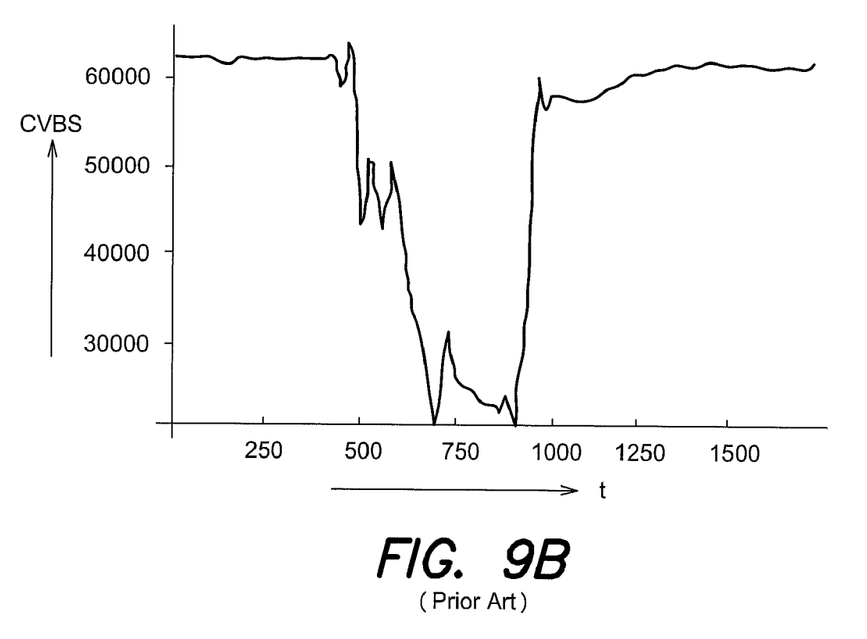

FIGS. 9A-9B illustrate part of a CVBS signal. In FIG. 9A, the horizontal synchronization pulse is clearly recognizable (at around 650<t<750). FIG. 9B shows the same case with an additional orthogonal perturbing component. The PLL loop in this case is not fast enough to demodulate the signal in an error-free manner. The horizontal synchronization pulse is distorted so much that a connected TV set cannot generate any stable picture from it.

Therefore, there is a need for a method and a circuit arrangement in which unperturbed demodulation of the signal is improved during the processing of the carrier, even when the transmitters are poorly aligned. There is also a need to estimate and compensate for the orthogonal perturbation.

SUMMARY OF THE INVENTION

Suppressing a perturbing quadrature component of a carrier signal of an amplitude-modulated signal during the recovery of the carrier signal in a synchronous demodulator, which outputs a quadrature signal, includes estimating the perturbing quadrature component of the carrier signal and the estimated quadrature component is subtracted from the quadrature signal.

An embodiment of the invention specifies measuring of the orthogonal carrier component contained in the signal and compensation for this within the carrier control process. Advantageously, the bandwidth of the PLL does not need to be changed in order to demodulate the information without sacrificing quality, in order to prevent a frequency-modulated sound signal from being perturbed by the existence of an orthogonal picture carrier component, in the example of analog television.

These and other objects, features and advantages of the present invention will become more apparent in light of the following detailed description of preferred embodiments thereof, as illustrated in the accompanying drawings.

BRIEF DESCRIPTION OF THE DRAWINGS

FIG. 1A illustrates a step from small signal amplitude to large signal amplitude, and FIG. 1B illustrates a step from large signal amplitude to small signal amplitude;

FIGS. 2A-2E show time plots of characteristic I/Q demodulated television signals and signals derived from them for estimating the orthogonal noise component of the picture carrier, where FIG. 2A illustrates an in-phase signal (approximately equal to amplitude of I/Q); FIG. 2B illustrates control deviation of the quadrature signal; FIG. 2C illustrates differential change in the information signal; FIG. 2D illustrates differential control deviation of the in-phase signal; and FIG. 2E illustrates multiplication of the change in the information signal and the differential control deviation of the quadrature signal;

FIG. 7B is with a perturbing component;

DETAILED DESCRIPTION OF THE INVENTION

The orthogonal perturbing component, which is known in English technical parlance as "modulator imbalance," can be estimated as discussed herein.

The orthogonal perturbing component appears as a DC voltage value in the Q pathway after the I/Q mixer. The carrier recovery process interprets this as a phase error (measured with a CORDIC) and thus regulates the digital I/Q oscillator to a presumably correct value. Upon a change in the amplitude of the IF signal (e.g., a change in picture content from white to black in the case of a television signal), a DC signal again becomes briefly visible in the Q pathway and it is regulated back again. The amplitude of the DC signal in the Q pathway depends on the magnitude and direction of the change in amplitude. The phasor diagram in FIGS. 1A and 1B illustrates this relationship by the example of the television signal.

Figure 1A:
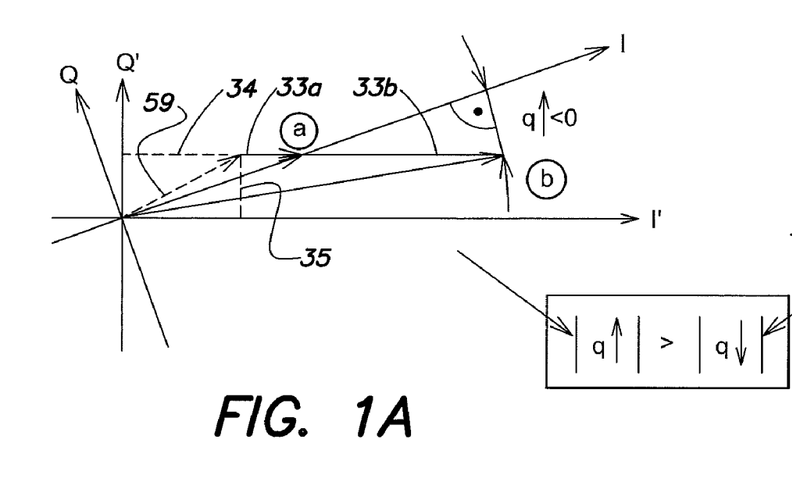
FIGS. 1A and 1B are phasor diagrams of a modulated television signal picture carrier with noise component before and after an amplitude step of the information signal, where
Figure 1B:
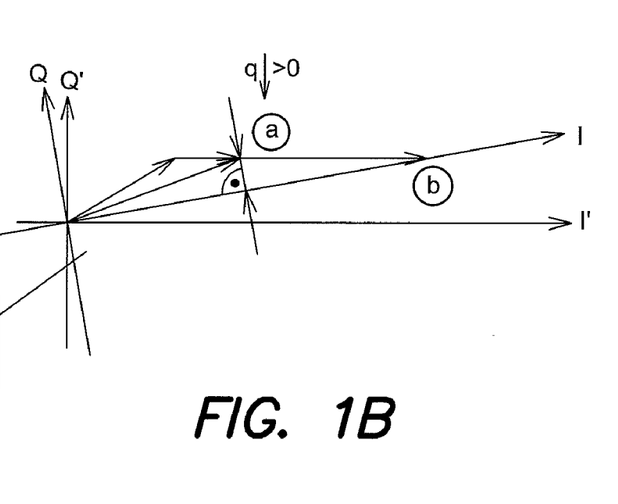

Referring to FIGS. 1A and 1B, the primed coordinate system I'/Q' shows a composition 59 of a modulated picture carrier 34 with perturbation component 35. Point (a) represents the signal at low information signal amplitude 33a (e.g., white level for analog TV) and point (b) shows a large information signal amplitude 33b (e.g., black level). The other coordinate system I/Q shows the particular coordinate system of the carrier recovery process in the locked-on state. As the signal changes from point (a) to (b), one at first gets a negative Q value q↑. In the converse situation, one gets a positive Q value q↓. As is evident from FIGS. 1A and 1B, a simple relationship prevails:

$$|q\uparrow| > |q\downarrow| \qquad (\text{EQ. 4})$$

Figure 2A:
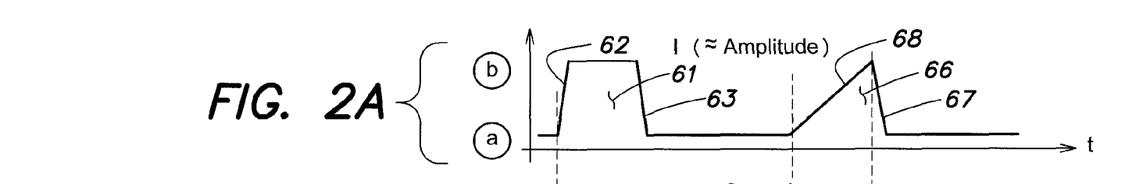
Figure 2B:
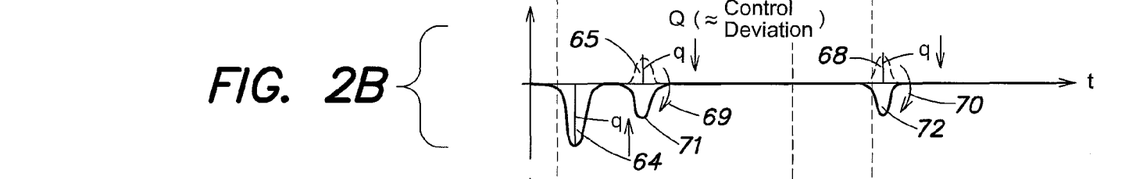

Referring to FIG. 2A, if positive changes 62 and negative changes 63 were to occur with equal frequency, as in the case of a (merely) rectangular information signal 61 (FIG. 2A), one may use this relationship to estimate the orthogonal perturbing component 35 by simple integration (integrals 64 and 65 in FIG. 2B) of the Q value q↑, q↓. But this cannot be assured, for example, in the case of an analog TV transmission.

For example, if one has an information signal 66 in the form of a sawtooth (video picture: grayscale; FIG. 2A), amplitude changes 67 necessary to estimate the orthogonal perturbation component 35 by the integral 68 of the Q value q↑, q↓, (FIG. 2B) only occur in one direction. The amplitude change 68 in the other direction is continuous and the resulting phase modulation may be continuously adjusted by the carrier recovery process (q↑=q↓=0 during signal edge in FIG. 2B). In this case, the estimate of the noise component is unreliable. It is therefore advantageous to correct the integration 64, 71, 72 of the Q value with the sign 69, 70 of the preceding amplitude change.

Ideally, the amplitude change is determined by the absolute value from the instantaneous I and Q value. A more economical solution is achieved—assuming that the carrier recovery process is locked in—by evaluating only the change in the I portion, as is shown for example in FIG. 2C.

Figure 2C:
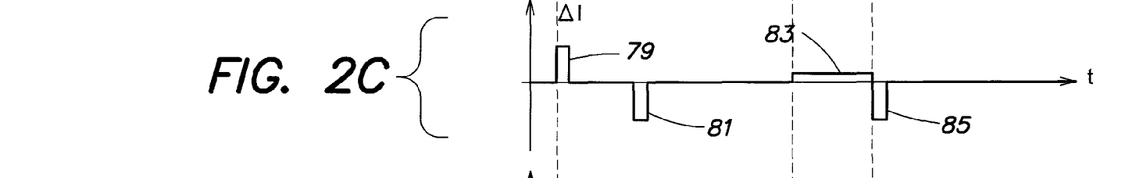
Figures 2D, 2E:
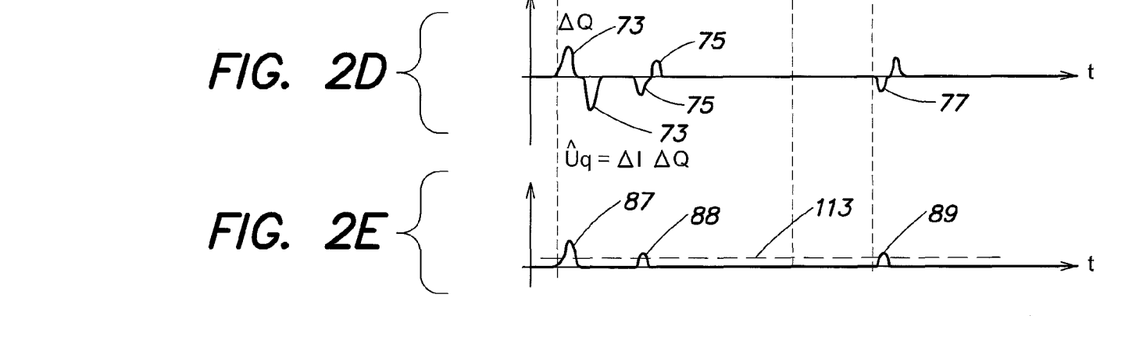

In order to render the measurement robust to phase changes of the picture carrier, it is advantageous to use the differential control deviations:

$$\Delta Q = \frac{dQ(t)}{dt} \qquad (\text{EQ. 5})$$

for the estimate. FIG. 2C shows the differential amplitude changes 79, 81, 83, 85 determined from the corresponding amplitude change 62, 63, 68, 67 of the in-phase signal I. The result of the estimate is obtained by the differential amplitude change:

$$\Delta I = \frac{dI(t)}{dt} \qquad (\text{EQ. 6})$$

of the in-phase component from the equation:

$$\hat{U}_Q = \overline{\Delta I(t) \cdot \Delta Q(t)} \qquad (\text{EQ. 7})$$

and for the described example from FIG. 2E. Here, the estimated values determined for the above-mentioned amplitude changes of the in-phase signal are designated by the references 87, 88 and 89.

Simulations show that the measurement of the perturbing component is subject to relatively large fluctuations and furthermore depends strongly on the information sent, since the effects of the perturbing component only become visible when there are amplitude changes in the information. Therefore, the measurement result is also low-pass filtered. The low-pass filtering is designated by 113 in FIG. 2E.

Figure 3:
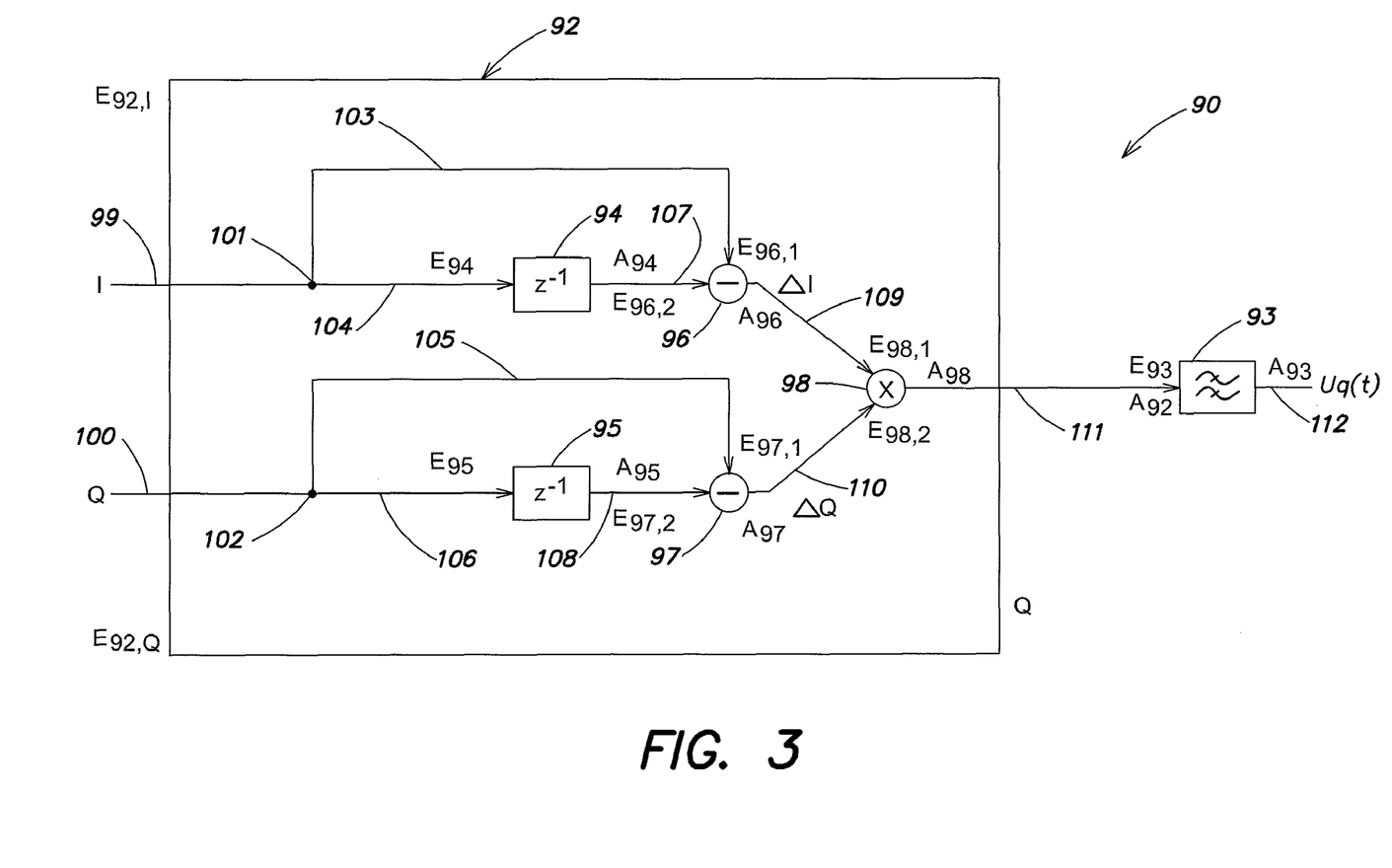
FIG. 3 is a block diagram of a digital circuit arrangement for the orthogonal noise estimation.

This method as described above can be implemented by the digital circuit arrangement 90 illustrated in FIG. 3 (e.g., the circuit arrangement 15 shown in FIG. 8).

The functioning of the control process in the overall system has been established by simulation. The effect, for example, on analog TV signals, is especially noticeable for picture contents with white levels at the end of a video line. If a strong orthogonal noise component is present, it will perturb the line synchronization pulse at the end of the line or the start of the next line and thus produce horizontal distortion in the subsequent lines.

Figure 5:
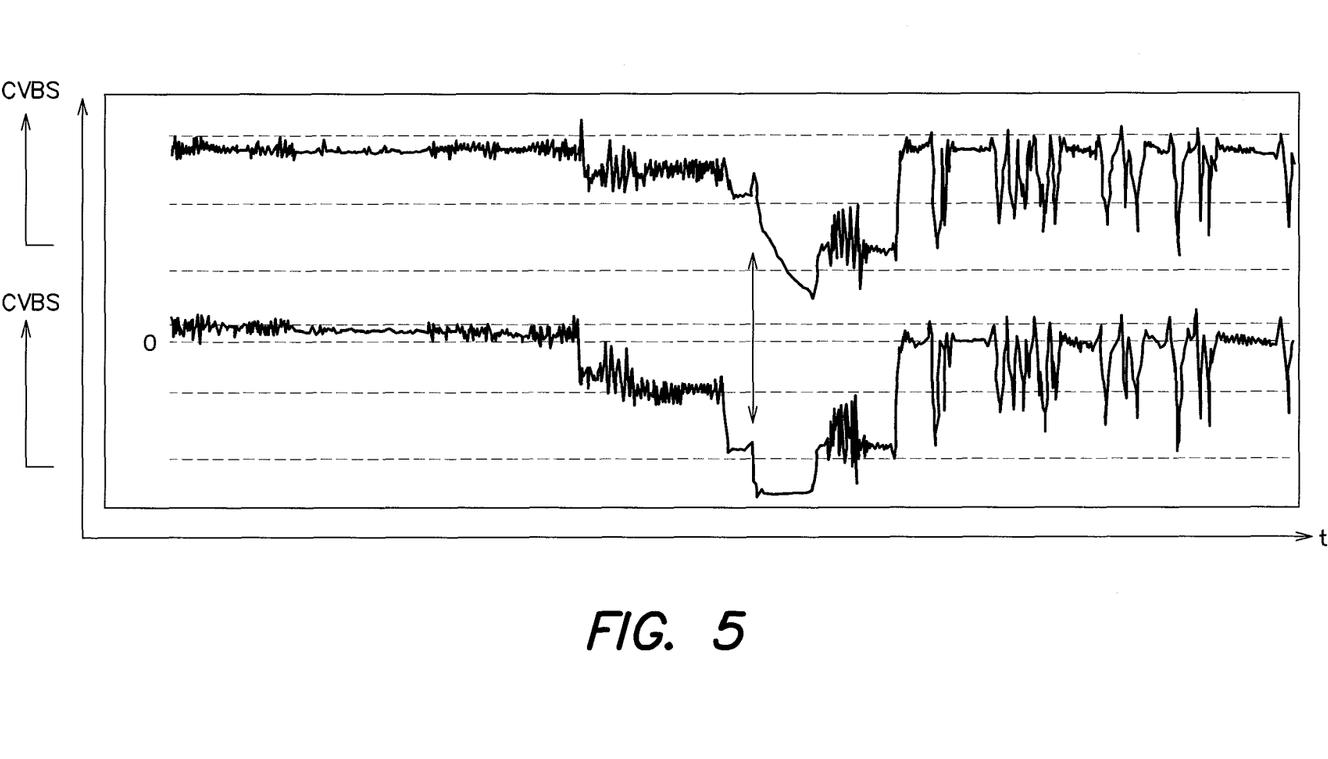
FIG. 5 illustrates a simulation result from an imbalance compensation.

FIG. 5 illustrates, like FIGS. 9A and 9B, a section of a CVBS signal. The signal contains a relatively strong orthogonal noise component and is distorted as already described above for the horizontal synchronization pulse (indicated by the arrow) (FIG. 9 top) and a TV set would not be able to generate a stable TV picture from this. In contrast, the imbalance compensation process is active in FIG. 9 bottom and has already established a final value. The orthogonal noise component is totally compensated and the signal is demodulated without error.

Figure 4:
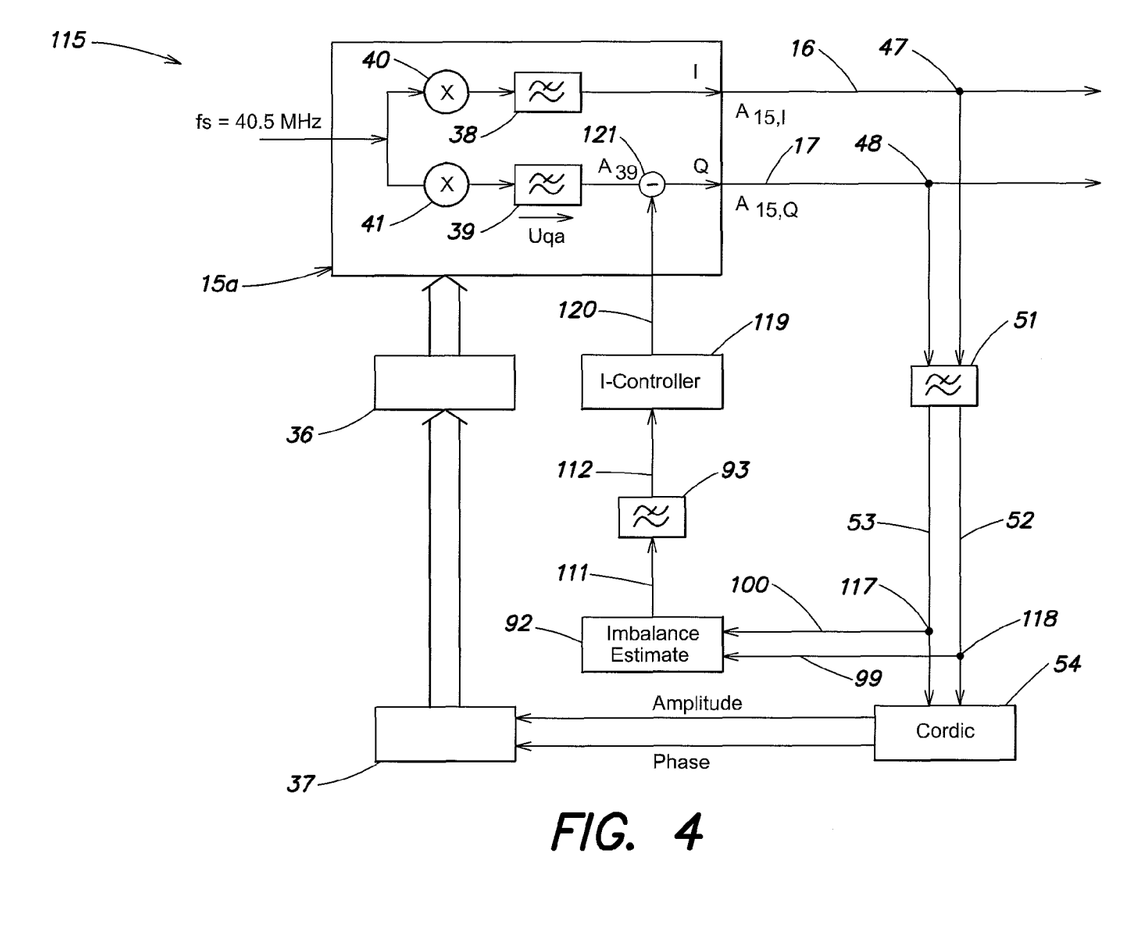
FIG. 4 is a block diagram of a synchronous demodulator with a carrier processing device and a device for estimating and compensating for an orthogonal perturbation.

This circuit arrangement can be implemented in a synchronous demodulator known from the prior art. FIG. 4 illustrates a synchronous demodulator 115 with orthogonal noise compensation. The synchronous demodulator 115 may include the circuit components of the synchronous demodulator 15 illustrated in FIG. 8, as well as a circuit arrangement for the orthogonal noise estimation. This circuit arrangement for orthogonal noise estimation may be identical in design to the circuit arrangement 92 of FIG. 3, for example.

Referring to FIG. 4, the signals on the lines 52, 53 between the low-pass filter 51 and the computer unit 54 are input to the circuit arrangement 92. The circuit arrangement 92 provides the output signal on the line 111 which is filtered to provide the filtered signal on the line 112. The filtered signal on the line 112 is input to an I-controller 119, which is output on the line 120.

The output signal on the line 120 is input to a difference unit 121, which also receives the output $A_{39}$ of the low-pass 39.

The low-pass filtered estimated signal $\vec{U}_{qa}$ with amplitude $\hat{U}_{qa}$ on the line 120 is subtracted from the quadrature signal Q by the mixer 121 and thereby compensated. It is contemplated that any other automatic control loop may be used in place of the I-controller 119.

The I-controller 119 first amplifies or attenuates the signal on the line 112 with an adjustable factor and then takes it to an integration element. The speed of the automatic control loop will be influenced by the adjustable factor. The current state of the integration element is at the same time the estimated signal $\vec{U}_{qa}$. The following should also be mentioned in connection with FIG. 3.

The control deviation is produced by the perturbing orthogonal component, since this results in the described phase modulation. By integration (and sign correction), the quadrature component is estimated from the control deviation. This only works with an automatic control loop, since the orthogonal noise component can not be calculated directly.

The actual noise estimation is designated by the circuit 90, illustrated in FIG. 3. Thanks to the use of the filter 93, the result of the estimate becomes more reliable. In any case, the noise estimate provided by the circuit 90 by itself cannot determine the absolute value of the noise component. It is only possible to determine a trend. This trend is utilized by charging or discharging the integrator in the I-controller 119, to obtain the absolute value of the noise component in the steady state of the automatic control loop.

Although the present invention has been illustrated and described with respect to several preferred embodiments thereof, various changes, omissions and additions to the form and detail thereof, may be made therein, without departing from the spirit and scope of the invention.

What is claimed is:

1. A method for suppression of a perturbing quadrature component of a carrier signal of an amplitude-modulated signal in the process of recovery of the carrier signal in a synchronous demodulator which provides a compensated quadrature signal and an in-phase signal, comprising:
   processing the compensated quadrature signal and a past value of the compensated quadrature signal to provide a quadrature difference signal;
   processing the in-phase signal and a past value of the in-phase signal to provide an in-phase difference signal;
   multiplying the quadrature difference signal and the in-phase difference signal to provide a multiplied signal;
   processing the multiplied signal to estimate the perturbing quadrature component of the carrier signal; and
   subtracting the estimated perturbing quadrature component from a quadrature signal to provide the compensated quadrature signal.

2. The method of claim 1, where the perturbing quadrature component of the carrier signal is estimated from an integral of a multiplied signal.

3. A circuit arrangement for suppression of a perturbing quadrature component of a carrier signal of an amplitude-modulated signal during the recovery of the carrier signal in a synchronous demodulator, which outputs a compensated quadrature signal and an in-phase signal, comprising:
   a first subtraction unit that provides a quadrature difference signal indicative of the difference between the compensated quadrature signal and a past value of the compensated quadrature signal;
   a second subtraction unit that provides an in-phase difference signal indicative of the difference between the in-phase signal and a past value of the in-phase signal;
   a multiplier that provides a multiplier output signal indicative of the product of the quadrature difference signal and the in-phase difference signal;
   a noise estimation device that receives a signal indicative of the multiplier output signal and provides an estimate of the perturbing quadrature component; and
   a third subtraction unit that subtracts the estimated perturbing quadrature component from the quadrature signal to provide the compensated quadrature signal.

4. The circuit arrangement of claim 3, where the noise estimating device is configured to estimate the perturbing quadrature component of the carrier signal from an integral of the multiplied signal.

5. A circuit arrangement for suppression of a perturbing quadrature component of a carrier signal of an amplitude-modulated signal during the recovery of the carrier signal in a synchronous demodulator, which outputs a compensated quadrature signal and an in-phase signal, comprising:
   means for providing a quadrature differential signal indicative of the difference between the compensated quadrature signal and a past value of the compensated quadrature signal;
   means for providing an in-phase difference signal indicative of the difference between the in-phase signal and a past value of the in-phase signal;
   a multiplier that provides a multiplier output signal indicative of the product of the quadrature difference signal and the in-phase difference signal;
   means responsive to a signal indicative of the multiplier output signal, for providing an estimate of the perturbing quadrature component; and
   a subtraction unit that subtracts the estimated perturbing quadrature component from the quadrature signal to provide the compensated quadrature signal.

6. A method for suppression of a perturbing quadrature component of a carrier signal of an amplitude-modulated signal in the process of recovery of the carrier signal in a synchronous demodulator which provides a compensated quadrature signal and an in-phase signal, comprising:
- processing the compensated quadrature signal and a past value of the compensated quadrature signal to provide a quadrature difference signal;
- processing the in-phase signal and a past value of the in-phase signal to provide an in-phase difference signal;
- processing the quadrature difference signal and the in-phase difference signal to provide an estimate of the perturbing quadrature component of the carrier signal; and
- subtracting the estimated perturbing quadrature component from a quadrature signal to provide the compensated quadrature signal.

* * * * *